(12) United States Patent
Wang

(10) Patent No.: US 11,367,618 B2
(45) Date of Patent: Jun. 21, 2022

(54) SEMICONDUCTOR PATTERNING PROCESS

(71) Applicant: Powerchip Semiconductor Manufacturing Corporation, Hsinchu (TW)

(72) Inventor: Zih-Song Wang, Nantou County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 161 days.

(21) Appl. No.: 16/924,131

(22) Filed: Jul. 8, 2020

(65) Prior Publication Data

US 2021/0351036 A1 Nov. 11, 2021

(30) Foreign Application Priority Data

May 5, 2020 (TW) .................................. 109114871

(51) Int. Cl.
*H01L 21/033* (2006.01)
(52) U.S. Cl.
CPC ...... *H01L 21/0338* (2013.01); *H01L 21/0335* (2013.01); *H01L 21/0337* (2013.01)
(58) Field of Classification Search
CPC ............. H01L 21/0335; H01L 21/0337; H01L 21/0338
See application file for complete search history.

(56) References Cited

U.S. PATENT DOCUMENTS

| 8,883,636 | B2 * | 11/2014 | Wang ................ H01L 27/11524 438/669 |
| 8,969,206 | B1 | 3/2015 | Sel et al. |
| 2012/0085733 | A1 | 4/2012 | Mebarki et al. |
| 2015/0137204 | A1 * | 5/2015 | Wang ................... H01L 23/528 257/314 |
| 2015/0179435 | A1 | 6/2015 | Wu et al. |
| 2021/0035803 | A1 * | 2/2021 | Junhong ............. H01L 21/0337 |

FOREIGN PATENT DOCUMENTS

TW 201005872 2/2010

OTHER PUBLICATIONS

"Office Action of Taiwan Counterpart Application", dated Sep. 8, 2021, p. 1-p. 4.

* cited by examiner

*Primary Examiner* — Walter H Swanson
(74) *Attorney, Agent, or Firm* — JCIPRNET

(57) ABSTRACT

A semiconductor patterning process includes the following steps. A substrate is provided, wherein the substrate has a first region, a second region, and a third region, and the second region is located between the first region and the third region. A plurality of initial mask patterns are formed on the substrate. A first mask material layer is conformally formed on the substrate. A first mask pattern is formed above at least two adjacent initial mask patterns in the second region and on the first mask material layer in between, and a second mask pattern is formed on the first mask material layer on sidewalls of remaining initial mask patterns. A portion of the first mask material layer is removed using the first mask pattern and the second mask pattern as a mask to form a final mask pattern on the substrate.

6 Claims, 13 Drawing Sheets

SEMICONDUCTOR PATTERNING PROCESS

CROSS-REFERENCE TO RELATED APPLICATION

This application claims the priority benefit of Taiwan application serial no. 109114871, filed on May 5, 2020. The entirety of the above-mentioned patent application is hereby incorporated by reference herein and made a part of this specification.

BACKGROUND OF THE INVENTION

Field of the Invention

The invention relates to a semiconductor patterning process.

Description of Related Art

With the rapid development of the integrated circuit industry, as the demand for circuit integration is increased, the size of the entire circuit device needs to be reduced and the requirements for the resolution of the lithography process are increased. At present, in order to overcome the limitations of light source resolution in the lithography process, the self-aligned double patterning (SADP) process, the self-aligned triple patterning (SATP) process, and the self-aligned quadruple patterning (SAQP) process are gradually developed to increase the degree of integration of devices.

However, the above various patterning processes may not meet the existing pattern design requirements. For example, the above various patterning processes may often only produce patterns with the same feature size, thus limiting the application range of these processes. In addition, a plurality of photomasks are needed in the various patterning processes above, thus resulting in higher production costs, and the accuracy of the resulting device pattern is readily affected.

SUMMARY OF THE INVENTION

The invention provides a semiconductor patterning process having greater design flexibility and simple process steps.

A semiconductor patterning process of the invention includes the following steps. A substrate is provided, wherein the substrate has a first region, a second region, and a third region, and the second region is located between the first region and the third region. A plurality of initial mask patterns are formed on the substrate. A first mask material layer is conformally formed on the substrate. A first mask pattern is formed above at least two adjacent initial mask patterns in the second region and on the first mask material layer in between, and a second mask pattern is formed on the first mask material layer on sidewalls of remaining initial mask patterns. A portion of the first mask material layer is removed using the first mask pattern and the second mask pattern as a mask to form a final mask pattern on the substrate.

In an embodiment of the semiconductor patterning process of the invention, the plurality of initial mask patterns have a same feature size.

In an embodiment of the semiconductor patterning process of the invention, a forming method of the first mask pattern and the second mask pattern includes the following steps. A second mask material layer is conformally formed on the first mask material layer. A patterned photoresist layer is formed on the second mask material layer, wherein the patterned photoresist layer is at least located above at least two adjacent initial mask patterns in the second region and on the second mask material layer in between. An anisotropic etching process is performed using the patterned photoresist layer as a mask to remove a portion of the second mask material layer. The patterned photoresist layer is removed.

In an embodiment of the semiconductor patterning process of the invention, after the first mask material layer is formed, a feature size of each of the plurality of initial mask patterns is reduced.

In an embodiment of the semiconductor patterning process of the invention, after the final mask pattern is formed, an anisotropic etching process is further performed using the final mask pattern as a mask to remove a portion of the substrate.

In an embodiment of the semiconductor patterning process of the invention, after the final mask pattern is formed, the following steps are further included. A patterned photoresist layer is formed on the substrate, wherein the patterned photoresist layer covers a portion of the substrate. An anisotropic etching process is performed using the final mask pattern and the patterned photoresist layer as a mask to remove a portion of the substrate.

A semiconductor patterning process of the invention includes the following steps. A substrate is provided, wherein the substrate has a first region, a second region, and a third region. A plurality of first initial mask patterns are formed on the substrate in the first region, a plurality of second initial mask patterns are formed on the substrate in the second region, and a plurality of third initial mask patterns are formed on the substrate in the third region, wherein a feature size of the second initial mask patterns and a feature size of the third initial mask patterns are greater than a feature size of the first initial mask patterns. A first mask material layer is conformally formed on the substrate. Mask spacers are formed on sidewalls of the first initial mask patterns, the second initial mask patterns, and the third initial mask patterns. A first patterned mask layer is formed in the third region. A portion of the first mask material layer is removed using the first patterned mask layers and the exposed mask spacers as a mask. A second patterned mask layer is formed, wherein the second patterned mask layer exposes the mask spacers in the second region adjacent to the third region. The mask spacers exposed by the first patterned mask layer and the second patterned mask layer and the first mask material layer below the mask spacers are removed. The first patterned mask layer and the second patterned mask layer are removed to form a final mask pattern on the substrate.

In an embodiment of the semiconductor patterning process of the invention, a forming method of the mask spacers includes the following steps. A second mask material layer is conformally formed on the first mask material layer. An anisotropic etching process is performed to remove a portion of the second mask material layer.

In an embodiment of the semiconductor patterning process of the invention, after the first mask material layer is formed, a feature size of each of the plurality of first initial mask patterns, the plurality of second initial mask patterns, and the plurality of third initial mask patterns is reduced.

In an embodiment of the semiconductor patterning process of the invention, after the final mask pattern is formed, an anisotropic etching process is further performed using the final mask pattern as a mask to remove a portion of the substrate.

In an embodiment of the semiconductor patterning process of the invention, after the final mask pattern is formed, the following steps are further included. A patterned photoresist layer is formed on the substrate, wherein the patterned photoresist layer covers a portion of the substrate. An anisotropic etching process is performed using the final mask pattern and the patterned photoresist layer as a mask to remove a portion of the substrate.

Based on the above, in the invention, for the initial mask patterns with the same feature size, a pattern with a greater feature size may be formed as needed without additional complicated steps, and therefore greater design flexibility and simple process steps may be achieved. In addition, when defining a mask pattern with a greater feature size, the lithography process may have a greater process window. In addition, the mask pattern applied to a peripheral region may be defined without performing a plurality of lithography processes, and therefore influence to the pattern of the peripheral region from a plurality of lithography processes may be prevented.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The semiconductor patterning process of the invention may be applied to various pattern designs. For example, the semiconductor patterning process of the invention may be applied to designs including a plurality of patterns with the same feature size and designs including a plurality of patterns with different feature sizes. In other words, the semiconductor patterning process of the invention may be highly flexible in pattern design. The semiconductor patterning process of the invention is described in detail below.

FIG. 1A to FIG. 1G are cross-sectional views of a semiconductor patterning process according to the first embodiment of the invention. In the present embodiment, the semiconductor patterning process is applied to designs including a plurality of patterns with the same feature size.

Figure 1A:
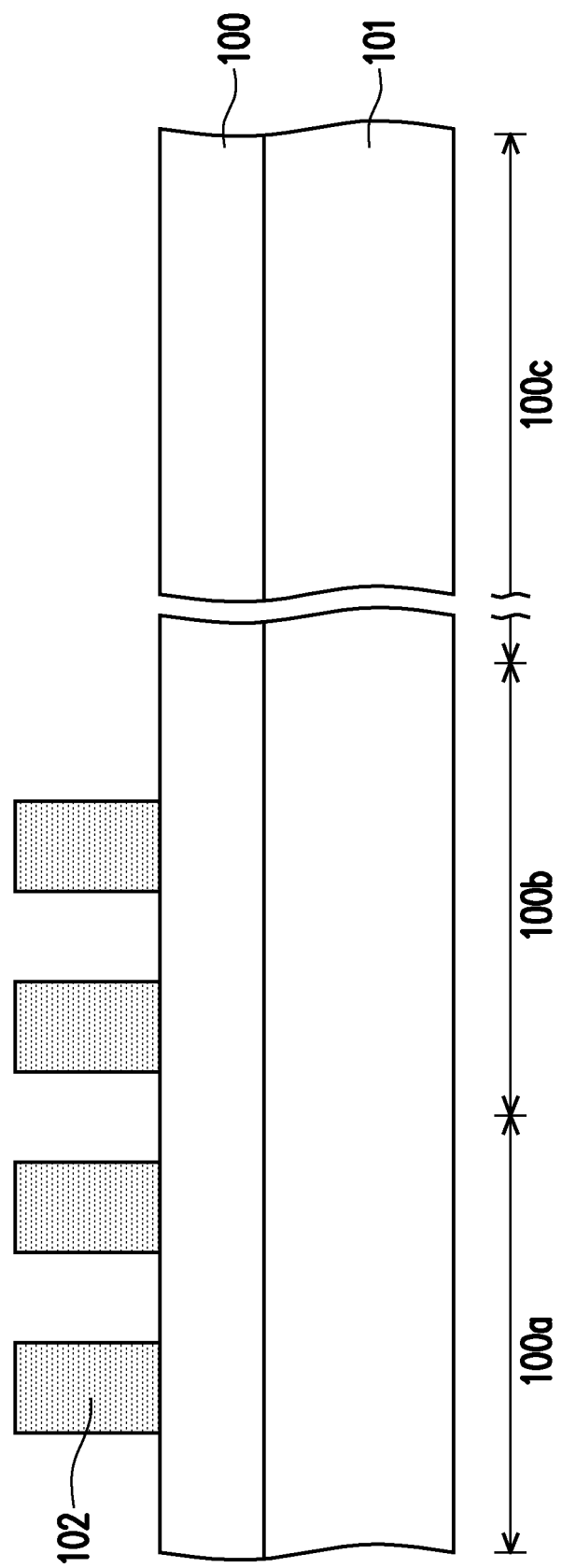
FIG. 1A to FIG. 1G are cross-sectional views of a semiconductor patterning process according to the first embodiment of the invention.

First, referring to FIG. 1A, a plurality of initial mask patterns 102 are formed on a substrate 100. The substrate 100 is a target substrate, that is, a substrate to be patterned. For example, the substrate 100 may be a silicon substrate, and in this case, the patterned substrate 100 may be used to define a trench pattern formed in the substrate 100, for example. Alternatively, the substrate 100 may be a dielectric substrate, and in this case, the patterned substrate 100 may be used to define a circuit pattern formed in the substrate 100, for example. Alternatively, the substrate 100 may be a conductive substrate, and in this case, the patterned substrate 100 may be used to define a gate structure, a word line structure, etc., for example. However, the substrate 100 in the invention is not limited to the above.

In the present embodiment, the substrate 100 is a conductive substrate, and is formed on a silicon base 101. In addition, the silicon base 101 has a first region 100a, a second region 100b, and a third region 100c. Therefore, the substrate 100 formed on the silicon substrate 101 also has a first region 100a, a second region 100b, and a third region 100c. In the present embodiment, the first region 100a is, for example, a dense region for forming memory cells, the third region 100c is, for example, a wide region forming a peripheral circuit region, and the second region 100b is a space region between the first region 100a and the third region 100c.

The initial mask patterns 102 have a different material from the substrate 100. For example, the initial mask patterns 102 may be photoresist layers, oxide layers, polysilicon layers, carbide layers, amorphous carbon layers, etc., which is not limited in the invention. In the present embodiment, the initial mask patterns 102 are, for example, photoresist layers, amorphous carbon layers, or polysilicon layers. A forming method of the initial mask patterns 102 is, for example, to first form a mask material layer on the substrate 100, and then to perform a lithography process and an etching process in sequence. In the present embodiment, the initial mask patterns 102 have the same feature size, and the spacing between two adjacent initial mask patterns 102 is equal to the feature size.

Figure 1B:
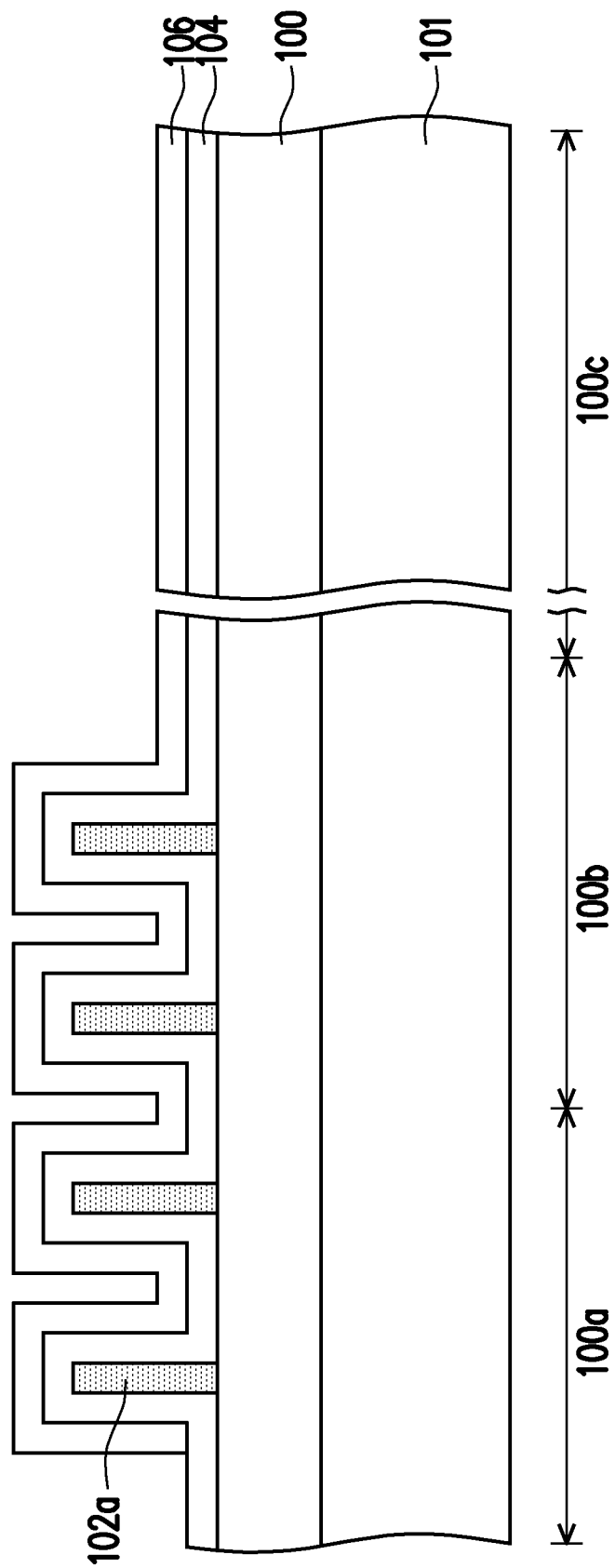

Next, referring to FIG. 1B, a first mask material layer 104 is conformally formed on the substrate 100. The first mask material layer 104 has a different material from the substrate 100 and the initial mask patterns 102. In the present embodiment, the first mask material layer 104 is, for example, an oxide layer, but the invention is not limited thereto. In addition, in the present embodiment, in the process of forming the first mask material layer 104, the feature size of the initial mask patterns 102 may be reduced. For example, in the present embodiment, the size of the initial mask patterns 102 may be reduced by etching. Before the first mask material layer 104 is formed and after the first mask material layer 104 is formed, the feature size of the initial mask patterns 102 may be further reduced via a compressive force provided by the first mask material layer 104, so that an initial mask pattern 102 with a greater feature size is reduced to an initial mask pattern 102a with a smallest feature size F, but the invention is not limited thereto. In addition, in the present embodiment, by adjusting process parameters, the resulting first mask material layer 104 has a thickness substantially equal to the smallest feature size F, so as to be suitable for the triple patterning process of the present embodiment.

Then, a second mask material layer 106 is conformally formed on the first mask material layer 104. The second mask material layer 106 has a different material from the substrate 100 and the first mask material layer 104. In the present embodiment, the second mask material layer 106 is, for example, a photoresist layer, an amorphous carbon layer, or a polysilicon layer, but the invention is not limited thereto. In the present embodiment, by adjusting process parameters, the resulting second mask material layer 106 has a thickness substantially equal to the smallest feature size F, so as to be suitable for the triple patterning process of the present embodiment.

Figure 1C:
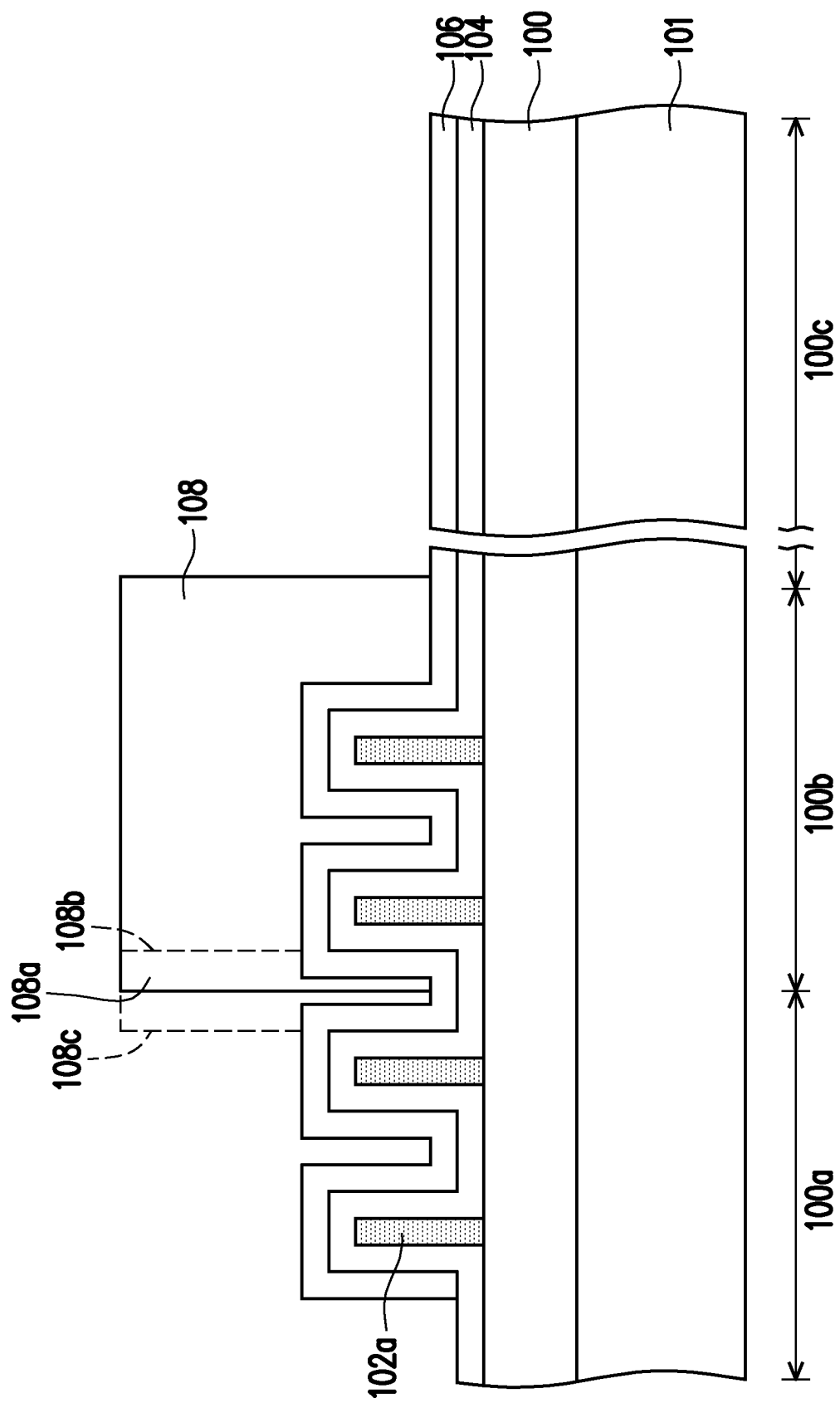

Then, referring to FIG. 1C, a patterned photoresist layer 108 is formed on the second mask material layer 106 in the second region 100b. In the present embodiment, the patterned photoresist layer 108 is located above two adjacent initial mask patterns 102a in the second region 100b and on the second mask material layer 106 in between. In detail, in the present embodiment, the patterned photoresist layer 108 covers two adjacent initial mask patterns 102a and the second mask material layer 106 located on the two initial mask patterns 102a. In other embodiments, the patterned photoresist layer 108 may also cover more initial mask patterns 102a adjacent to each other.

In the present embodiment, by merging two adjacent initial mask patterns 102a to define a pattern with a greater feature size at the substrate 100 in a subsequent process, the mask pattern generated by merging must be separated from another initial mask pattern 102a adjacent thereto in the first region 100a. In addition, since the first mask material layer 104 is removed in a subsequent process, a boundary 108a of the patterned photoresist layer 108 needs to at least be aligned with a side surface of the first mask material layer 104 on the sidewalls at an outer side of two initial mask patterns 102a to be merged (as indicated by a dotted line 108b), and the boundary 108a of the patterned photoresist layer 108 is at most aligned with a side surface of the first mask material layer 104 on the sidewalls of another initial mask pattern 102a of two adjacent initial mask patterns 102a to be merged (as indicated by a dotted line 108c).

In this way, in the present embodiment, when the patterned photoresist layer 108 is formed, an offset range of a region covered by the patterned photoresist layer 108 may be greater, that is, a greater process window may be achieved. In detail, since the initial mask patterns 102 have a greater feature size, the initial mask pattern 102a with reduced size has the smallest feature size F, and the thicknesses of the first mask material layer 104 and the second mask material layer 106 are substantially both the smallest feature size F, the boundary 108a of the patterned photoresist layer 108 only needs to be located within the range between the dotted line 108b and the dotted line 108c, and does not need to be specifically aligned with the dotted line 108b or the dotted line 108c. In the present embodiment, the boundary 108a of the patterned photoresist layer 108 is located in the middle of the dotted line 108b to the dotted line 108c.

Figure 1D:
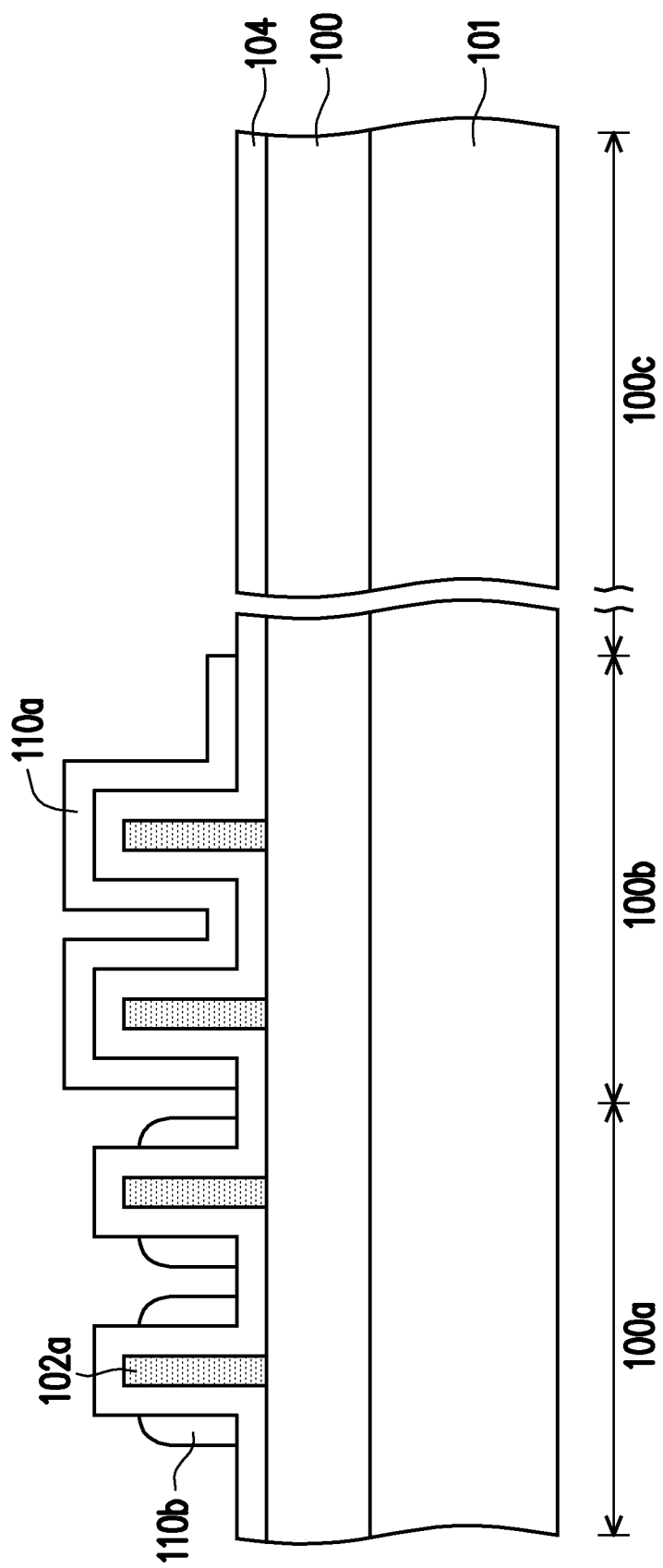

Next, referring to FIG. 1D, an anisotropic etching process is performed using the patterned photoresist layer 108 as a mask to remove a portion of the second mask material layer 106. In the present embodiment, since the material of the second mask material layer 106 is different from the material of the first mask material layer 104, the first mask material layer 104 may be used as an etch stop layer. Then, the patterned photoresist layer 108 is removed. In this way, a first mask pattern 110a is formed above two adjacent initial mask patterns 102a and on the first mask material layer 104 in between, and a second mask pattern 110b is formed on the first mask material layer 104 on the sidewalls of the remaining initial mask patterns 102a. In the present embodiment, the second mask pattern 110b on the sidewalls of the initial mask patterns 102a may be regarded as mask spacers. In particular, in the present embodiment, during the anisotropic etching process, the sidewalls of the patterned photoresist layer 108 are also slightly removed at the same time, so the leftmost sidewall of the resulting second mask pattern 110b is substantially planar, but the invention is not limited thereto.

Figure 1E:
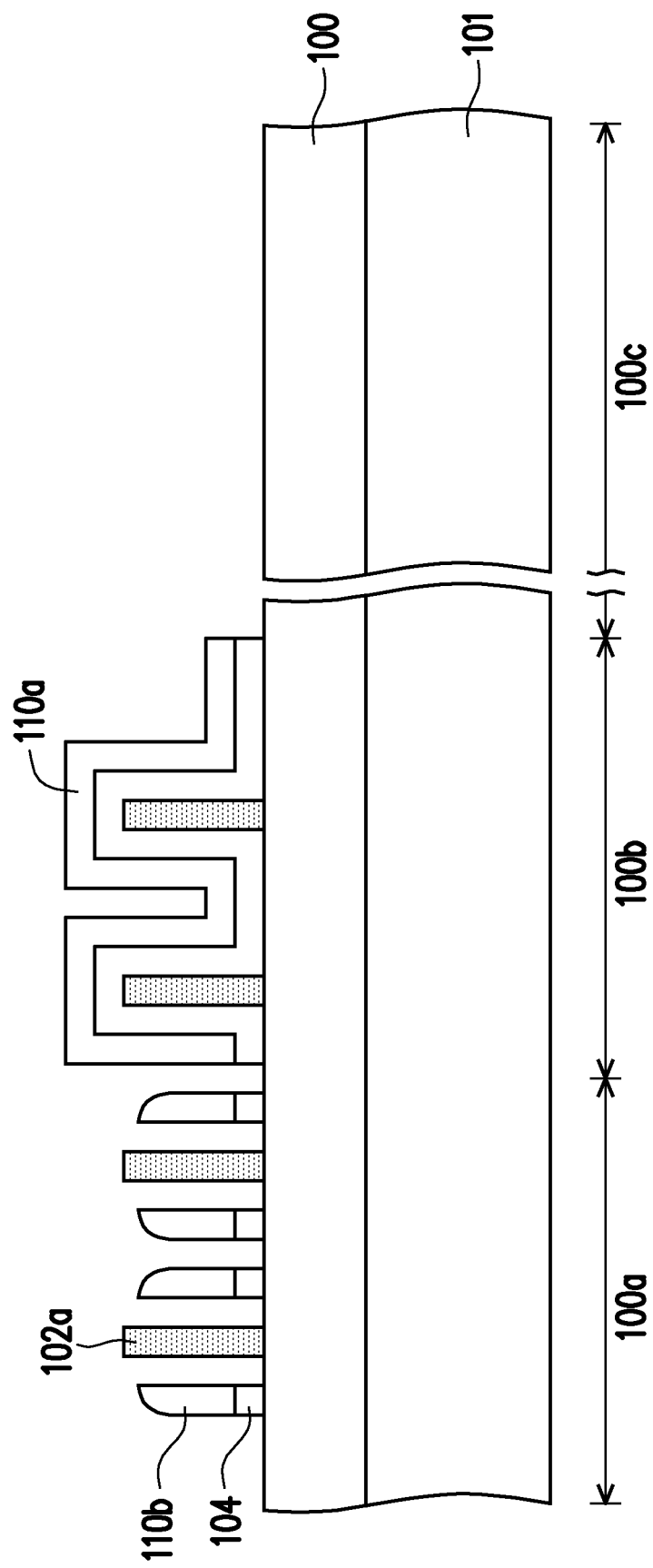

Then, referring to FIG. 1E, using the first mask pattern 110a and the second mask pattern 110b as a mask, an anisotropic etching process is performed to remove a portion of the first mask material layer 104. In this way, a final mask pattern may be formed on the substrate 100 in a "self-aligning" manner. In the present embodiment, the final mask pattern formed on the substrate 100 includes a first portion in the second region 100b formed by two adjacent initial mask patterns 102a and the first mask material layer 104 and the first mask pattern 110a covering the two adjacent initial mask patterns 102a, a second portion in the first region 100a formed by the second mask pattern 110b and the first mask material layer 104 below, and a third portion in the first region 100a formed by the remaining initial mask patterns 102a. In addition, the final mask pattern is used to pattern the substrate 100 to define a desired target pattern.

Figure 1F:
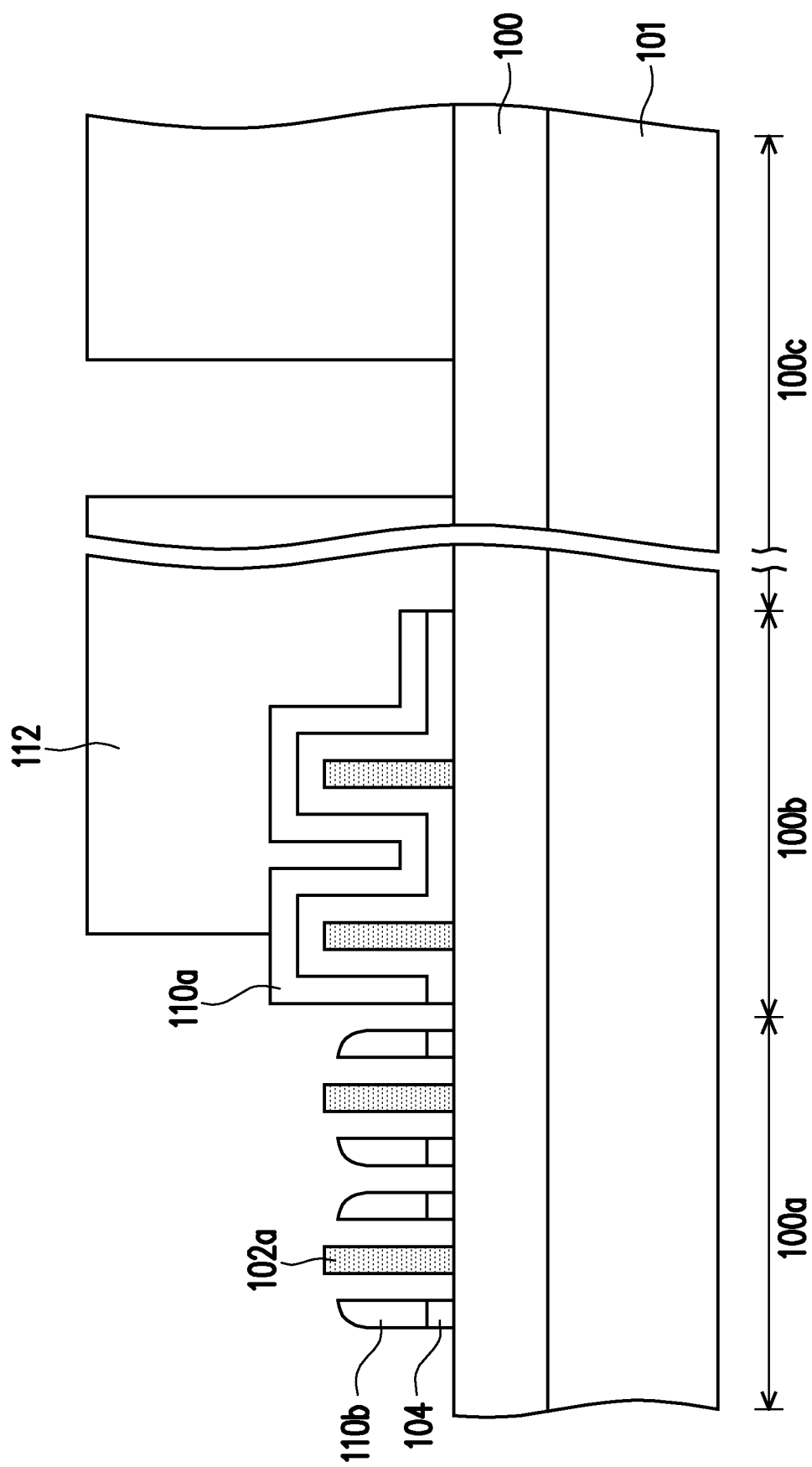

Next, referring to FIG. 1F, depending on actual need, after the final mask pattern is formed, a patterned photoresist layer 112 covering a portion of the substrate 100 may be optionally formed on the substrate 100.

Figure 1G:
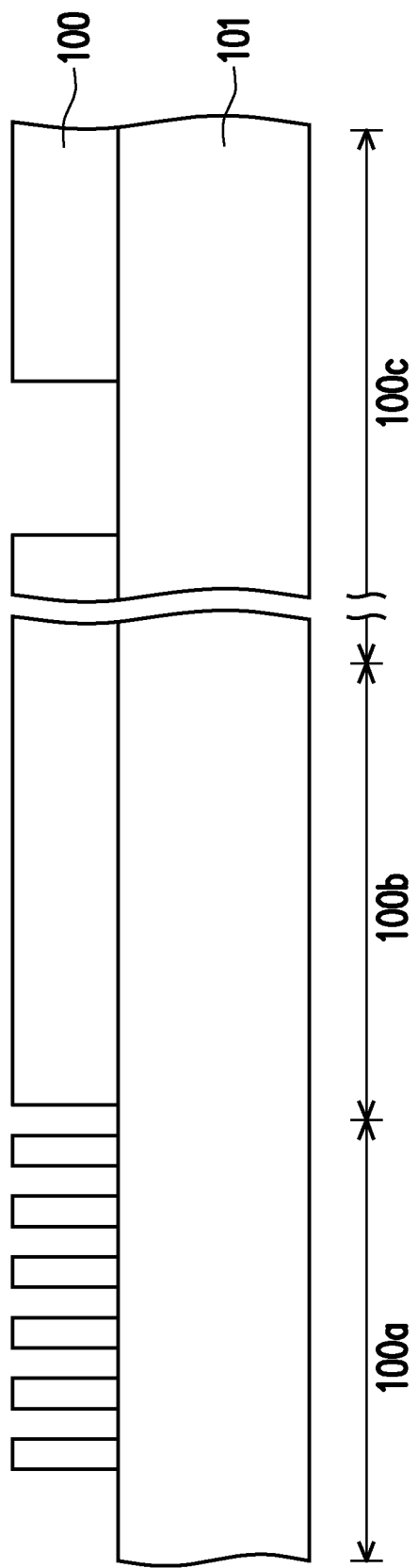

Next, referring to FIG. 1G, using the final mask pattern and the patterned photoresist layer 112 as a mask, an anisotropic etching process is performed to remove a portion of the substrate 100 to define a desired target pattern in the substrate 100. As described above, depending on the type of the substrate 100, a pattern may be defined in the substrate 100 or the entire substrate 100 may be defined as a desired pattern.

For example, when the semiconductor patterning process described above in FIG. 1A to FIG. 1G is applied to a memory process, the final mask pattern may be used to define word lines and select gates. In detail, the first portion of the final mask pattern (with a greater feature size) may be used to define the select gates, and the second portion and the third portion of the final mask pattern (with a smaller and the same feature size) may be used to define the word lines. In addition, peripheral devices (such as logic devices) may be defined in the third region 100c.

As may be seen from the above, in the semiconductor patterning process of the present embodiment, for initial mask patterns 102 with the same feature size, not only may patterns with the same feature size be defined in the first region 100a of the substrate 100, patterns with a greater feature size may also be defined by combining adjacent initial mask patterns 102 in the second region 100b of the substrate 100 (as described in FIG. 1C). In other words, the semiconductor patterning process of the present embodiment may form patterns with different feature sizes in different regions of the substrate according to actual needs, and no extra complicated steps are needed. Therefore, the semiconductor patterning process of the present embodiment may have greater design flexibility and simple process steps compared to the existing SADP process, SATP process, and SAQP process.

FIG. 2A to FIG. 2F are cross-sectional views of a semiconductor patterning process according to the second embodiment of the invention. In the present embodiment, the semiconductor patterning process is applied to designs including a plurality of patterns with different feature sizes. In addition, in the present embodiment, the same devices as in the first embodiment are described with the same reference numerals.

Figure 2A:
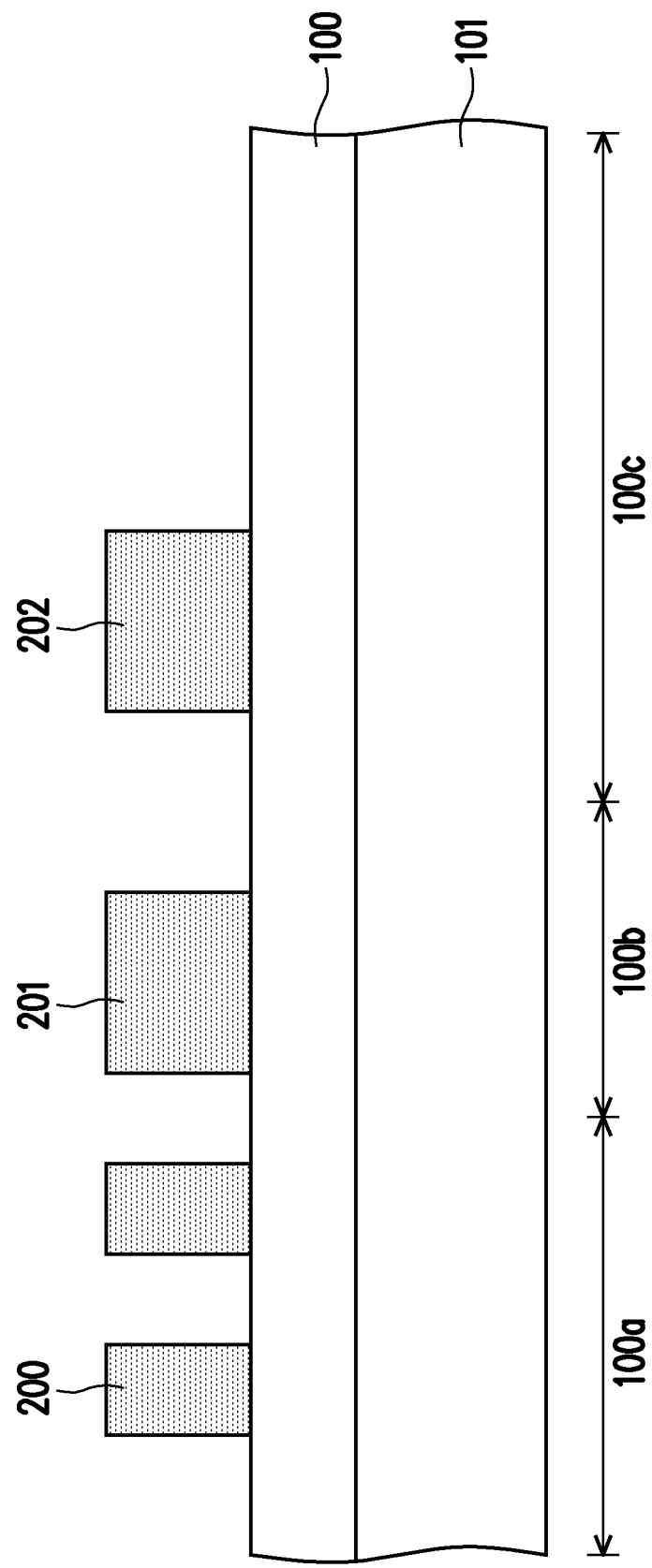
FIG. 2A to FIG. 2F are cross-sectional views of a semiconductor patterning process according to the second embodiment of the invention.

First, referring to FIG. 2A, the substrate 100 is provided. In the present embodiment, the substrate 100 is a conductive substrate, and is formed on the silicon base 101. In addition, the silicon base 101 has a first region 100a, a second region 100b, and a third region 100c. Therefore, the substrate 100 formed on the silicon substrate 101 also has the first region 100a, the second region 100b, and the third region 100c. A plurality of initial mask patterns are formed on the substrate 100. In the first region 100a, a plurality of first initial mask patterns 200 are formed on the substrate 100. In the second region 100b, a plurality of second initial mask patterns 201 are formed on the substrate 100. In the third region 100c, a plurality of third initial mask patterns 202 are formed on the substrate 100. In addition, the feature sizes of the second initial mask patterns 201 and the third initial mask patterns 202 are greater than the feature size of the first initial mask patterns 200. In the present embodiment, the feature sizes of the second initial mask patterns 201 and the third initial mask patterns 202 are the same, but the invention is not limited thereto. The first initial mask patterns 200, the second initial mask patterns 201, and the third initial mask patterns 202 have different materials from the substrate 100. For example, the first initial mask patterns 200, the second initial mask patterns 201, and the third initial mask patterns 202 may be photoresist layers, oxide layers, polysilicon layers, carbide layers, amorphous carbon layers, etc., which is not limited in the invention. In the present embodiment, the first initial mask patterns 200, the second initial mask patterns 201, and the third initial mask patterns 202 are, for example, photoresist layers, amorphous carbon layers, or polysilicon layers.

Figure 2B:
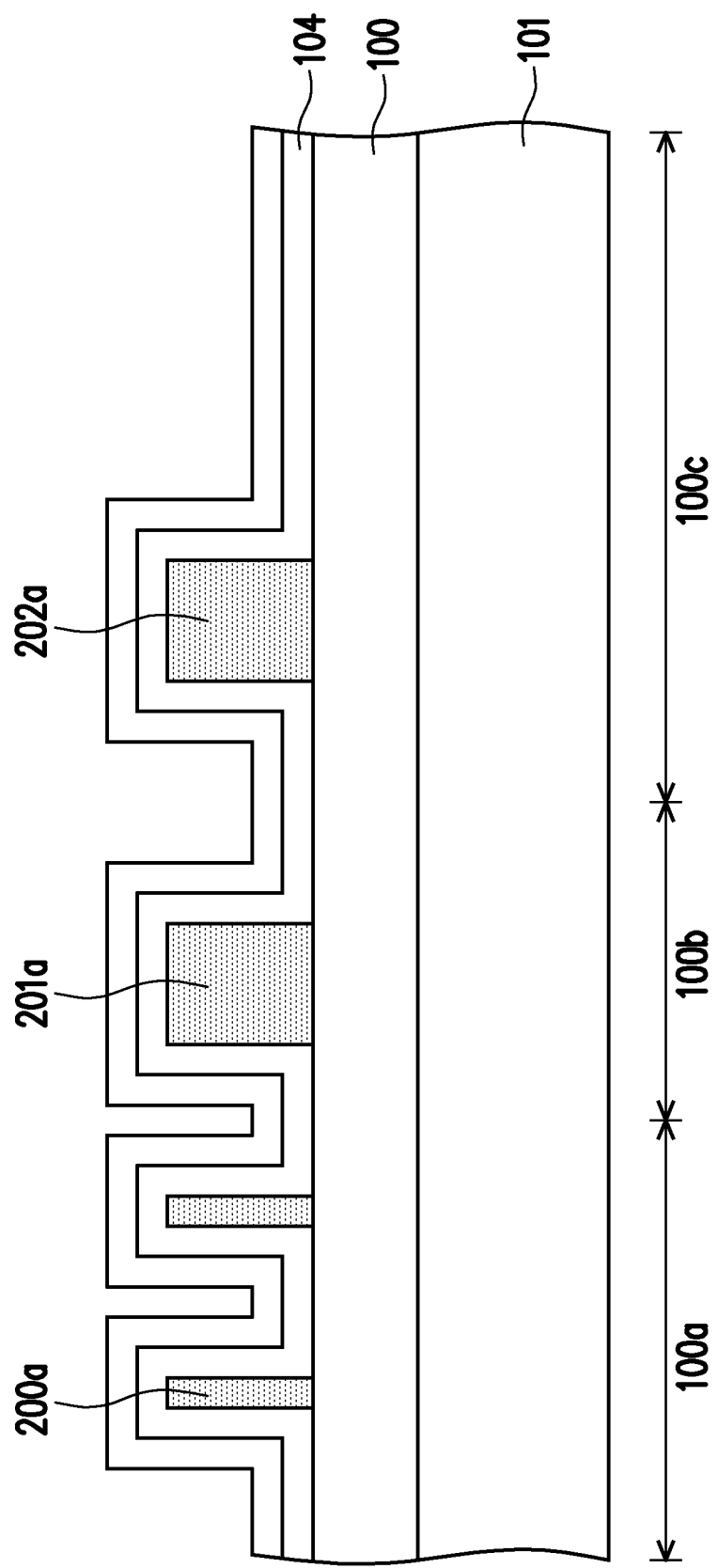

Next, referring to FIG. 2B, the first mask material layer 104 is conformally formed on the substrate 100. The first mask material layer 104 has a different material from the substrate 100, the first initial mask patterns 200, the second initial mask patterns 201, and the third initial mask patterns 202. In the present embodiment, the first mask material layer 104 is, for example, an oxide layer, but the invention is not limited thereto. In addition, in the present embodiment, in the process of forming the first mask material layer 104, the feature sizes of the first initial mask patterns 200, the second initial mask patterns 201, and the third initial mask patterns 202 may be reduced. For example, in the present embodiment, before the first mask material layer 104 is formed, the feature sizes of the first initial mask patterns 200, the second initial mask patterns 201, and the third initial mask patterns 202 may be reduced, for example, by etching, and after the first mask material layer 104 is formed, the feature sizes of the first initial mask patterns 200, the second initial mask patterns 201, and the third initial mask patterns 202 may be further reduced by a compressive force provided by the first mask material layer 104, so that the first initial mask patterns 200 with a greater feature size are reduced to first initial mask patterns 200a with the smallest feature size F, and the second initial mask patterns 201 and the third initial mask patterns 202 with greater feature sizes are reduced to second initial mask patterns 201a and third initial mask patterns 202a with smaller feature sizes, but the invention is not limited thereto. In addition, in the present embodiment, by adjusting process parameters, the resulting first mask material layer 104 has a thickness substantially equal to the smallest feature size F, so as to be suitable for the triple patterning process of the present embodiment. Then, a second mask material layer 106 is conformally formed on the first mask material layer 104. In the present embodiment, by adjusting the process parameters, the resulting second mask material layer 106 has a thickness substantially equal to the smallest feature size F, so as to be suitable for the triple patterning process of the present embodiment.

Figure 2C:
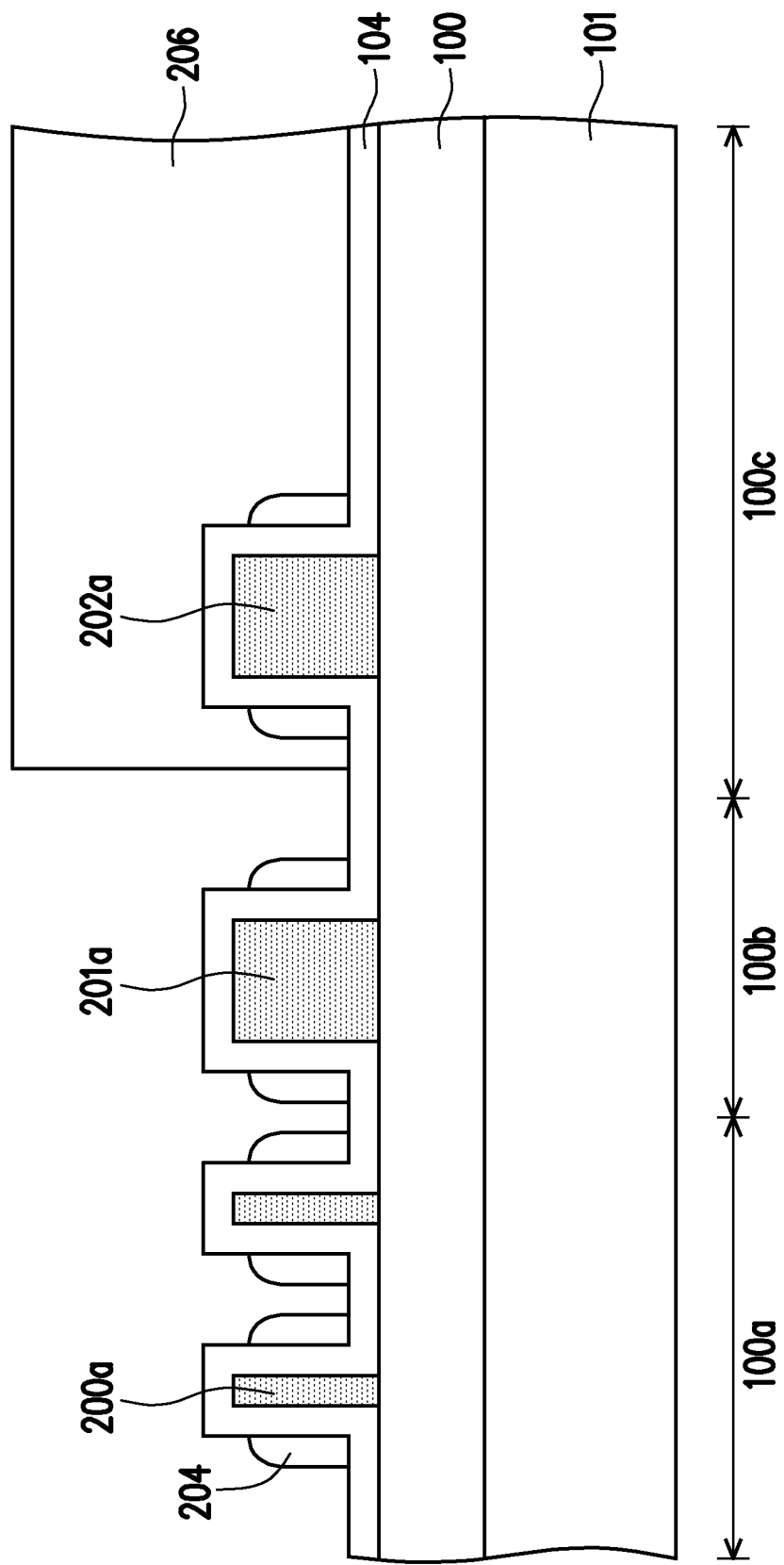

Then, referring to FIG. 2C, an anisotropic etching process is performed to remove a portion of the second mask material layer 106. In the present embodiment, since the material of the second mask material layer 106 is different from the material of the first mask material layer 104, the first mask material layer 104 may be used as an etch stop layer. In this way, mask spacers 204 are formed on the first mask material layer 104 on the sidewalls of the first initial mask patterns 200, the second initial mask patterns 201, and the third initial mask patterns 202. Next, a first patterned mask layer 206 is formed in the third region 100c. In the present embodiment, the first patterned mask layer 206 is, for example, a patterned photoresist layer. Then, using the first patterned mask layer 206 and the exposed mask spacers 204 as a mask, a portion of the first mask material layer 104 is removed.

Figure 2D:
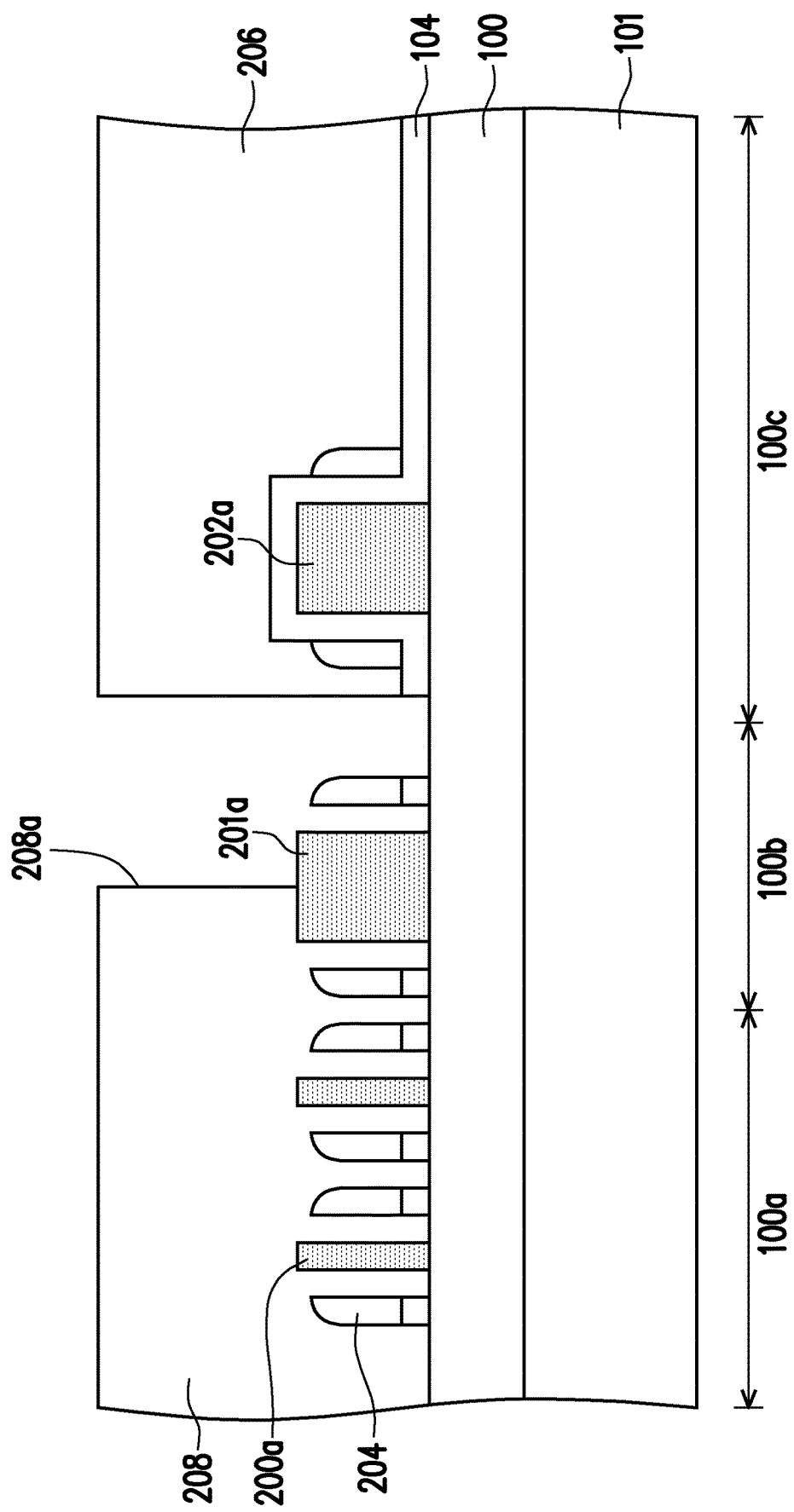

Next, referring to FIG. 2D, a second patterned mask layer 208 is formed on the substrate 100. The second patterned mask layer 208 exposes the mask spacers 204 in the second region 100b adjacent to the third region 100c. In the present embodiment, a boundary 208a of the second patterned mask layer 208 is located on the second initial mask patterns 201a, but the invention is not limited thereto. In other embodiments, the boundary 208a of the second patterned mask layer 208 may be located on the substrate 100, as long as the mask spacers 204 in the second region 100b adjacent to the third region 100c are exposed. In the present embodiment, the second patterned mask layer 208 is, for example, a patterned photoresist layer.

Figure 2E:
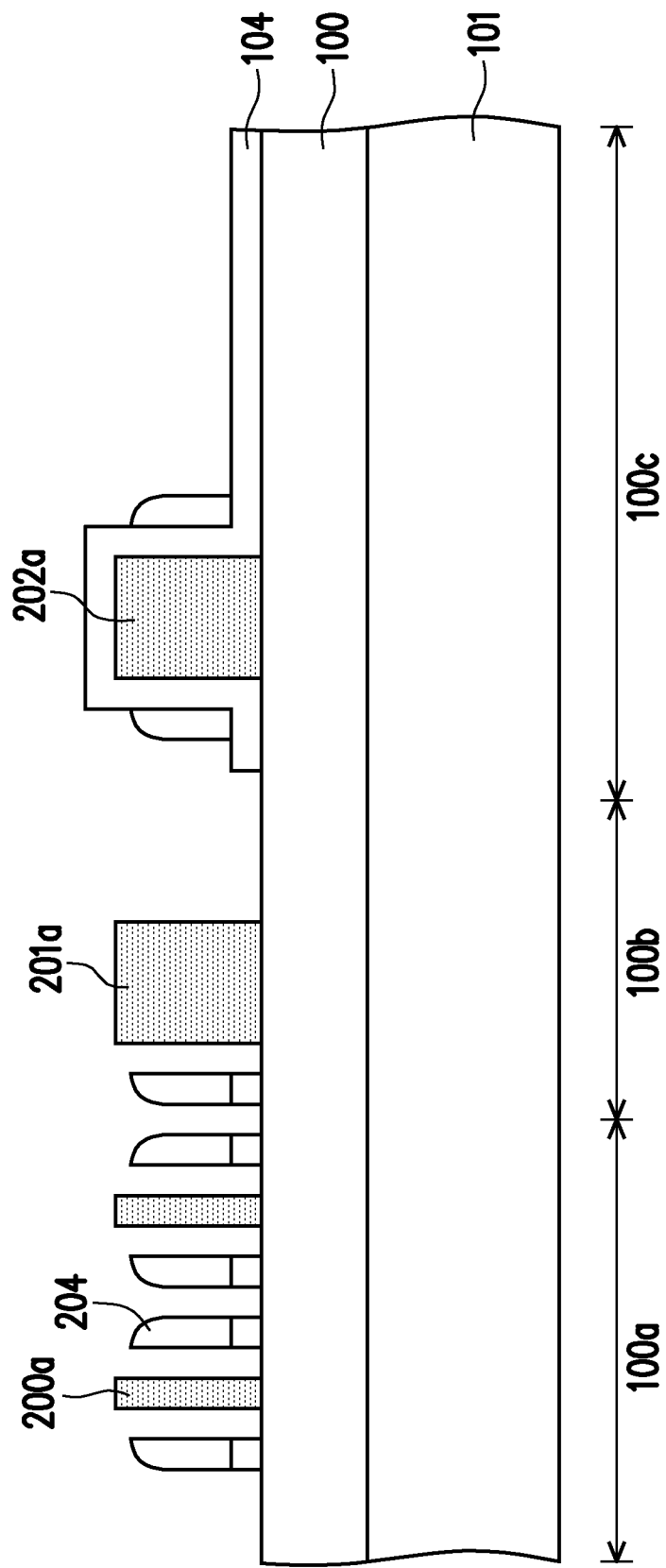

Then, referring to FIG. 2E, using the first patterned mask layer 206 and the second patterned mask layer 208 as a mask, an anisotropic etching process is performed to remove the exposed mask spacers 204 and the first mask material layer 104 below. Then, the first patterned mask layer 206 and the second patterned mask layer 208 are removed. In this way, a final mask pattern is formed on the substrate 100. In the present embodiment, the final mask pattern formed on the substrate 100 includes a first portion in the first region 100a and the second region 100b formed by the mask spacers 204 and the first mask material layer 104 below, a second portion formed by the first initial mask patterns 200a in the first region 100a, a third portion formed by the second initial mask patterns 201a, and a fourth portion in the third region 100c formed by the third initial mask patterns 202a and the first mask material layer 104 and the mask spacers 204 covering the third initial mask patterns 202a. In addition, the final mask pattern is used to pattern the substrate 100 to define a desired target pattern.

Figure 2F:
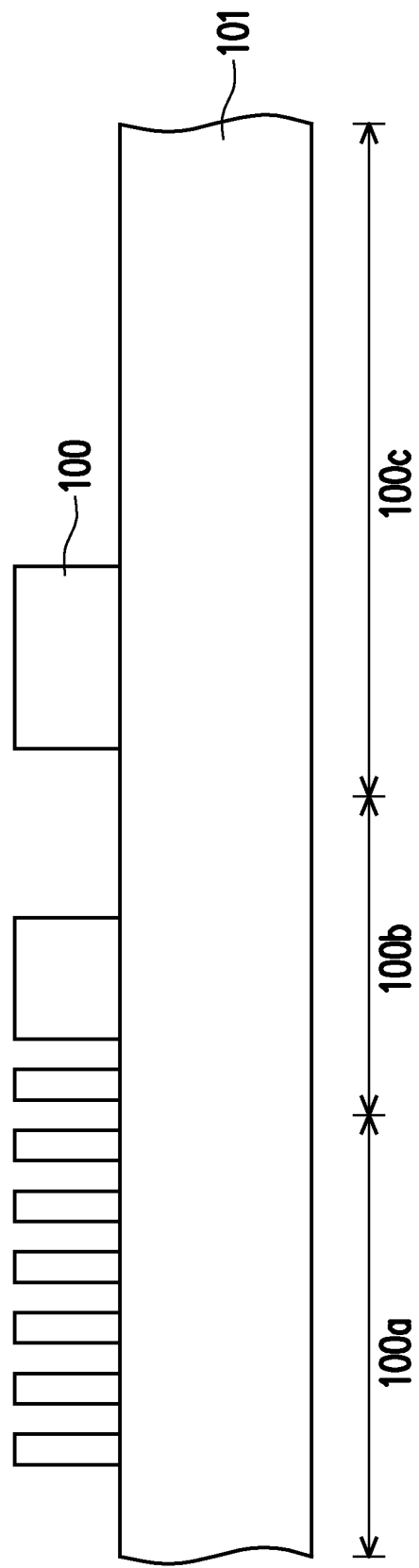

Next, referring to FIG. 2F, an anisotropic etching process is performed using the final mask pattern as a mask to remove a portion of the substrate 100 to define a desired target pattern. Alternatively, as described in FIG. 1F, depending on actual needs, after the final mask pattern is formed, a patterned photoresist layer (not shown) covering a portion of the substrate 100 may be formed on the substrate 100, and then a portion of the substrate 100 is removed using the final mask pattern and the patterned photoresist layer as a mask to define a desired target pattern in the substrate 100. In particular, in the actual process, the horizontal portion of the first mask material layer 104 and the mask spacers 204 in the third region 100c are removed at the same time during the anisotropic etching, thereby defining the structure shown in FIG. 2F.

For example, when the semiconductor patterning process described in FIG. 2A to FIG. 2F is applied to a memory process, the final mask pattern may be used to define word lines in the first region 100a and the second region 100b, and select gates are defined by the second initial mask patterns 201a. In addition, in the third region 100c, the fourth portion of the final mask pattern may be used to define peripheral devices (such as logic devices, etc.) In the present embodiment, since the mask spacers 204 in the second region 100b adjacent to the third region 100c and the first mask material layer 104 below are removed, after the substrate 100 is patterned, no other devices are between the select gates and the peripheral devices. In this way, the distance between the select gates and the peripheral devices may be reduced, which is beneficial to the development of miniaturization of semiconductor devices. In addition, in the present embodiment, the above object may be achieved using only one photomask, and another photomask is not needed to remove the mask spacers 204 in the third region 100c and the first mask material layer 104 below. Therefore, the effects of reducing process steps and reducing costs may be achieved.

In addition, in the present embodiment, when the mask spacers 204 in the second region 100b are removed, only the patterned photoresist layer 208 covering the first region 100a is formed and additional patterned photoresists are not needed. Therefore, the influence from a plurality of lithography processes on the pattern in the second region 100b may be reduced.

What is claimed is:

1. A semiconductor patterning process, comprising:
providing a substrate, wherein the substrate has a first region, a second region, and a third region, and the second region is located between the first region and the third region;
forming a plurality of initial mask patterns on the substrate;
forming a first mask material layer conformally on the substrate;
forming a first mask pattern above at least two adjacent initial mask patterns in the second region and on the first mask material layer in between, and forming a second mask pattern on the first mask material layer on sidewalls of remaining initial mask patterns; and
removing a portion of the first mask material layer using the first mask pattern and the second mask pattern simultaneously as a mask in one etching process to form a final mask pattern on the substrate.

2. The semiconductor patterning process of claim 1, wherein the plurality of initial mask patterns have a same feature size.

3. The semiconductor patterning process of claim 1, wherein a forming method of the first mask pattern and the second mask pattern comprises:
forming a second mask material layer conformally on the first mask material layer;
forming a patterned photoresist layer on the second mask material layer, wherein the patterned photoresist layer is at least located above the at least two adjacent initial mask patterns in the second region and on the second mask material layer in between;
performing an anisotropic etching process using the patterned photoresist layer as a mask to remove a portion of the second mask material layer; and
removing the patterned photoresist layer.

4. The semiconductor patterning process of claim 1, wherein after the first ask material layer is formed, a feature size of each of the plurality of initial mask patterns is reduced.

5. The semiconductor patterning process of claim 1, further comprising, after the final mask pattern is formed:
performing an anisotropic etching process using the final mask pattern as a mask to remove a portion of the substrate.

6. The semiconductor patterning process of claim 1, further comprising, after the final mask pattern is formed:
forming a patterned photoresist layer on the substrate, wherein the patterned photoresist layer covers a portion of the substrate; and
performing an anisotropic etching process using the final mask pattern and the patterned photoresist layer as a mask to remove a portion of the substrate.

* * * * *